(12) United States Patent
Fujita et al.

(10) Patent No.: US 7,517,516 B2
(45) Date of Patent: Apr. 14, 2009

(54) HIGH PURITY CARBONACEOUS MATERIAL AND CERAMIC COATED HIGH PURITY CARBONACEOUS MATERIAL

(75) Inventors: Ichiro Fujita, Mitoyo-gun (JP); Satoru Nogami, Mitoyo-gun (JP)

(73) Assignee: Toyo Tanso Co., Ltd., Osaka (JP)

( * ) Notice: Subject to any disclaimer, the term of this patent is extended or adjusted under 35 U.S.C. 154(b) by 638 days.

(21) Appl. No.: 10/958,409

(22) Filed: Oct. 6, 2004

(65) Prior Publication Data

US 2005/0079359 A1 Apr. 14, 2005

(30) Foreign Application Priority Data

Oct. 10, 2003 (JP) .............................. 2003-351635
Mar. 9, 2004 (JP) .............................. 2004-065823

(51) Int. Cl.
*C01B 31/00* (2006.01)
*C01B 31/04* (2006.01)
*B32B 9/04* (2006.01)
*D01F 9/12* (2006.01)

(52) U.S. Cl. ............... 423/448; 423/445 R; 423/447.1; 423/447.2; 428/367; 428/408; 428/411.1

(58) Field of Classification Search ................ 428/212, 428/408, 367, 411.1; 423/448, 445 R, 447.1, 423/447.2
See application file for complete search history.

(56) References Cited

U.S. PATENT DOCUMENTS

| 4,161,743 | A | * | 7/1979 | Yonezawa et al. ............ 257/636 |
| 4,690,717 | A | * | 9/1987 | Yamazaki ..................... 438/96 |
| 4,701,427 | A | * | 10/1987 | Boecker et al. ............... 501/92 |
| 4,833,034 | A | * | 5/1989 | Maya ........................ 428/408 |
| 5,045,298 | A | * | 9/1991 | Muramatsu et al. ..... 423/445 R |
| 5,248,705 | A | * | 9/1993 | McGuigan et al. .......... 521/149 |
| 5,505,929 | A | | 4/1996 | Matsumoto et al. |
| 5,525,556 | A | * | 6/1996 | Dunmead et al. ............. 501/92 |
| 6,030,595 | A | | 2/2000 | Sumiya et al. |
| 6,277,501 | B1 | * | 8/2001 | Fujikawa ................... 428/641 |
| 6,881,680 | B2 | * | 4/2005 | Fujita ....................... 438/758 |
| 2002/0038889 | A1 | * | 4/2002 | Yamazaki et al. ........... 257/347 |
| 2003/0232001 | A1 | * | 12/2003 | Fujita .................... 423/445 R |
| 2005/0106423 | A1 | * | 5/2005 | Fujita ........................ 428/698 |

FOREIGN PATENT DOCUMENTS

| CN | 1040638 | 11/1998 |
| EP | 1 375 423 A1 | 1/2004 |
| GB | 798644 | 7/1958 |
| GB | 894441 | 4/1962 |
| JP | 2002-249376 | 9/2002 |

OTHER PUBLICATIONS

Derwent Abstract, 1974, XP-002221498, SU-394303.

\* cited by examiner

*Primary Examiner*—Timothy C Vanoy
*Assistant Examiner*—Serena L Hanor
(74) *Attorney, Agent, or Firm*—Oblon, Spivak, McClelland, Maier & Neustadt, P.C.

(57) ABSTRACT

The invention provides a high purity carbonaceous material which is reduced in contents of oxygen, nitrogen and chlorine readily binding to carbon atoms and in contents of elements, phosphorus, sulfur and boron, readily binding to carbon atoms upon heating and which can be used in producing single crystals such as semiconductors, a high purity carbonaceous material for use as a substrate for ceramic layer coating, and a ceramic layer-coated high purity carbonaceous material. The high purity carbonaceous material has oxygen content of $1\times10^{18}$ atoms/cm$^3$ or less as determined by SIMS. Its chlorine content is preferably $1\times10^{16}$ atoms/cm$^3$ or less as determined by SIMS, and its nitrogen content is preferably $5\times10^{18}$ atoms/cm$^3$ or less as determined by SIMS. Its phosphorus, sulfur and boron contents are preferably not higher than respective specified values. Such a high purity carbonaceous material is coated with ceramic layer.

11 Claims, 1 Drawing Sheet

HIGH PURITY CARBONACEOUS MATERIAL AND CERAMIC COATED HIGH PURITY CARBONACEOUS MATERIAL

FIELD OF THE INVENTION

This invention relates to a carbonaceous material with a very low impurity content and, more particularly, to a high purity carbonaceous material suited for use in the semiconductor industry in producing silicon single crystals, silicon carbide (SiC) single crystals, gallium nitride (GaN), calcium fluoride ($CaF_2$) and so forth or in the nuclear industry and for use as a substrate for ceramic layer coating. It also relates to a ceramic coated high purity carbonaceous material comprising such high purity carbonaceous material as a substrate.

BACKGROUND OF THE INVENTION

Carbonaceous materials are not only excellent in various mechanical characteristics but also advantageous in that they hardly react with metals. Therefore, they are widely used in the semiconductor, machinery and nuclear industries.

In recent years, the market for silicon semiconductors and compound semiconductors, typically SiC and GaN has rapidly expanded. With such market expansion, the requirement imposed on carbonaceous materials have become severer. In addition, carbonaceous materials are also used in the growth of $CaF_2$ single crystals, which are used for emitting short wavelength excimer laser beams in semiconductor lithography (hereinafter referred to as "photo etching") for attaining large scale integration of semiconductors.

Enhanced resolution is required in semiconductor photo etching and, for realizing resolution enhancement, $CaF_2$ has come into use for emitting short wavelength excimer laser beams, such as krypton fluoride (248 nm), argon fluoride line (193 nm) nad fluorine (157 nm). In connection with this, lenses made of fluorite (single crystal $CaF_2$) have come into use, since the conventional noncrystalline optical materials cannot transmit light at 193 nm. In the following, the production of $CaF_2$ single crystals is described specifically. $CaF_2$ single crystals are produced by the Bridgman technique of Czochralski (CZ) process. The use of a graphite material as jigs in furnaces, such as heating elements, in the production of $CaF_2$ single crystals by the Bridgman technique, for instance, is described in Laid-open Japanese Patent Application (JP Kobai) No. 2000-137101.

Graphite materials generally contain metal impurities entrapped in pores and between graphite lattices thereof, hence they as such cannot be used in semiconductor manufacturing. Therefore, the applicants have previously proposed, for use in the semiconductor and nuclear industries, high purity graphite materials having a metal impurity (ash) content of 5 ppm or less as a result of treatment of graphite materials with a halogen-containing gas, for instance, for attaining high levels of purity (JP Kokai No. S64(1989)-18964; Japanese Patent Publication (JP Kokoku) No. H06 (1994)-35325). They have also recently proposed, in JP Kokai 2002-249376, carbonaceous materials with reduced nitrogen content for use in the manufacture of compound semiconductors.

However, even if such high purity graphite materials reduced in metal impurity content and in nitrogen content as disclosed in the above-cited patent documents are used as jigs in furnace, the yield in the production of $CaF_2$ single crystals becomes very low, less than 10%, because impurities, such as oxygen, chlorine, phosphorus and sulfur, have an unfavorable effect.

An object of the present invention is to provide the high purity carbonaceous material, which have not only reduced oxygen, nitrogen, chlorine, phosphorus and sulfur content in pores, but also reduced amounts of oxygen, nitrogen, chlorine, phosphorus, sulfur and boron which are bound to carbon atoms in graphite material.

SUMMARY OF THE INVENTION

As a result of intensive investigations to accomplish the above object, the present inventors identified purification treatment conditions which are suited for the removal of the above-described impurity elements, namely the reductions in the content of carbon atom-bound oxygen, nitrogen, chlorine, phosphorus, sulfur and boron. Based on such and other findings, the present invention has been completed.

The present invention provides a high purity carbonaceous material having oxygen content of $1\times10^{18}$ atoms/$cm^3$ or less analyzed by SIMS (secondary ion mass spectrometry). For instance, it is necessary to reduce the oxygen concentration to a level as low as possible in producing silicon carbide single crystals. The use of a carbonaceous material with an oxygen content of $1\times10^{18}$ atoms/$cm^3$ or less makes it possible to obtain single crystals having good semiconductor characteristics. More preferably, the oxygen content is $3\times10^{17}$ atoms/$cm^3$ or less, most preferably $1\times10^{17}$ atoms/$cm^3$ or less.

In another aspect, the invention provides a high purity carbonaceous material having a chlorine content of $1\times10^{16}$ atoms/$cm^3$ or less analyzed by SIMS. When the carbonaceous material used as furnace jigs in epitaxial growth of SiC and has a chlorine concentration of $5\times10^{15}$ atoms/$cm^3$ or less, it becomes possible to markedly decrease the chlorine in the epitaxial growth layer. Thus, the chlorine content is more preferably $8\times10^{15}$ atoms/$cm^3$ or less, most preferably $5\times10^{15}$ atoms/$cm^3$ or less.

In a further aspect, the invention provides a high purity carbonaceous material having a nitrogen content of $5\times10^{18}$ atoms/$cm^3$ or less as measured by SIMS. In producing silicon carbide single crystals, it is necessary to reduce the nitrogen concentration, which is the main impurity, as far as possible. The use of a carbonaceous material with a nitrogen content of $5\times10^{18}$ atoms/$cm^3$ or less makes it possible to markedly reduce the nitrogen concentration in SiC single crystals. More preferably, the nitrogen content is $5\times10^{17}$ atoms/$cm^3$ or less, most preferably $5\times10^{16}$ atoms/$cm^3$ or less.

In a further aspect, the invention provides a high purity carbonaceous material having a phosphorus content of $1\times10^{16}$ atoms/$cm^3$ or less as measured by SIMS. The use of a carbonaceous material with a phosphorus content of $1\times10^{16}$ atoms/$cm^3$ or less as jigs for the production of SiC single crystals makes it possible to markedly reduce the phosphorus concentration in the single crystals. More preferably, the phosphorus content is $3\times10^{15}$ atoms/$cm^3$ or less, most preferably $1\times10^{15}$ atoms/$cm^3$ or less.

In a further aspect, the invention provides a high purity carbonaceous material having a sulfur content of $1\times10^{16}$ atoms/$cm^3$ or less as measured by SIMS. When $CaF_2$ single crystals are produced using a carbonaceous materials having a sulfur content of $1\times10^{16}$ atoms/$cm^3$ or less as heating elements, it becomes possible to markedly improve the transmissivity thereof More preferably, the sulfur content is $5\times10^{15}$ atoms/$cm^3$ or less, most preferably $3\times10^{15}$ atoms/$cm^3$ or less.

In a still further aspect, the invention provides a high purity carbonaceous material having a boron content of $5\times10^{16}$ atoms/$cm^3$ or less as measured by SIMS. Boron is one of the major impurities in the production of SiC semiconductors.

When production jigs made of a carbonaceous material with a boron concentration of $5\times10^{16}$ atoms/cm$^3$ or less, are used for manufacturing semiconductors, SiC single crystals with low boron concentration and excellent semiconductor characteristics can be produced. More preferably, the boron content is $1\times10^{16}$ atoms/cm$^3$ or less, most preferably $5\times10^{15}$ atoms/cm$^3$ or less.

In this way, the invention can provide the extremely high purity carbonaceous material, which has not only reduced oxygen, nitrogen, chlorine, phosphorus and sulfur content in pores, but also reduced oxygen, nitrogen, chlorine, phosphorus, sulfur and boron readily bound to carbon atoms in the inventive carbon materials.

The high purity carbonaceous material of the invention can prevent crystal defects during the manufacturing of SiC single crystals, silicon single crystals, GaN single crystals or CaF$_2$ single crystals, among others, and therefore can be adequately used in the production of such crystals. In addition, it can be used as the material of jigs for the epitaxial growth of SiC, GaN, silicon, etc.

Furthermore, the high purity carbonaceous material of the invention can be used as a substrate material for ceramic coatings such as SiC, boron nitride, tantalum carbide and so on.

When the above high purity carbonaceous material is used as a substrate material for ceramic coatings and the surface thereof is coated with ceramic such as SiC, boron nitride or tantalum carbide, ceramic layer-coated high purity carbonaceous materials with extremely low impurity concentrations can be produced.

DETAILED DESCRIPTION OF THE INVENTION

Figure 1:
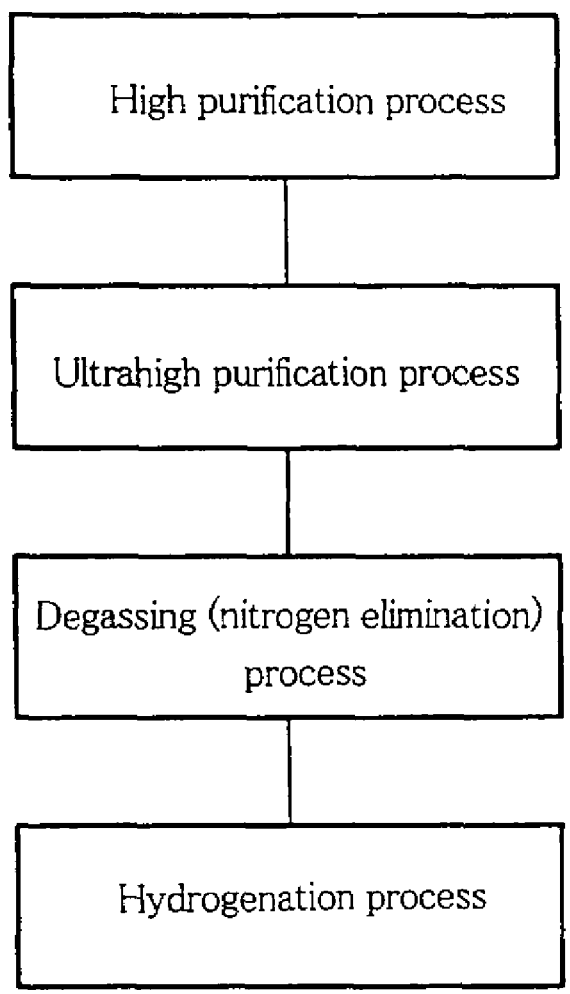
FIG. 1 is a flowchart illustrating a process for producing the high purity carbonaceous material of the invention.

First, the high purity carbonaceous material of the invention is described in detail.

The high purity carbonaceous material of the invention is derived from a material, which is extremely purified carbon material defined in the conventional meaning. Thus, it is derived, by treatment for purification, from (1) a calcined carbonaceous material prepared by mixing up one or more of finely divided natural graphite, artificial graphite, petroleum coke, coal coke, pitch coke, carbon black and mesocarbon, and a binder such as pitch, coal tar, coal tar pitch or a thermosetting resin, followed by kneading, pulverizing, molding and calcining, or a graphitized carbonaceous material derived therefrom by further graphitizing according to need, (2) a noncrystalline (glassy) carbonaceous material prepared by carbonization of a thermosetting resin such as a phenol resin, (3) a carbon fiber-reinforced, carbon-based composite material produced by the resin char process comprising repetitions of a procedure consisting of coating/impregnation of one of various carbon fibers such as polyacrylonitrile (PAN)-, pitch- or rayon-derived ones with a binder selected from among pitch, phenol resins and other ones mentioned above, molding, calcining and resin impregnation, or a carbon fiber-reinforced, carbon-based composite material resulting from impregnation or coating with pyrolytic carbon in lieu of the resin, or (4) a sheet form of graphite prepared by 10- to several hundred-fold expansion of natural or artificial graphite, followed by compression molding, for instance.

A process for producing the high purity carbonaceous material of the invention is now described.

A flowchart illustrating the process for producing the high purity carbonaceous material of the invention is shown in FIG. 1.

The process for producing the high purity carbonaceous material of the invention comprises the process of purity improvement by treatment in a gaseous atmosphere of halogen or compound thereof, for example chlorine, trichloromethane, dichloromethane, monochloromethane, fluorine, trifluoromethane, difluoromethane, monofluoromethane, monochlorotrifluoromethane, dichlorofluoromethane, trichlorofluorometha ne, monochloroethane, monochlorofluoroethane, monochlorodifluoroethane, monochlorotrifluoroethane, dichloroethane, dichloromonofluoroethane, dichlorodifluoroethane, dichlorotrifluoroethane, trichloroethane, trichloromonofluoroethane, trichlorodifluoroethane or tetrachloroethane, at the temperature of 2400° C. or higher (preferably 2450° C. or higher) to thereby eliminate such impurity metals as boron (B) and vanadium (V) (high purification process).

Thereafter, further purification is performed by treatment in a gaseous atmosphere comprising a halogen or a compound thereof under reduced pressure, namely at the pressure between 0.1 and 0.2 MPa (preferably between 0.5 Pa and 0.05 MPa), and at the temperature of 2000° C. or higher (preferably 2050° C. to 2400° C.) to thereby eliminate those metals which are capable of forming volatile halides (ultrahigh purification process).

Further, the carbonaceous material performed by these high purification process is heated between 1400 and 1600° C., preferably between 1450 and 1550° C., in a vacuum furnace at the reduced pressure 100 Pa or lower (preferably 50 Pa or lower) for a period of 5 hours or longer (preferably 10 hours or longer) to thereby eliminate volatile impurities such as nitrogen and oxygen (degassing (nitrogen elimination) process).

Finally, following the degassing (nitrogen elimination) process, hydrogen is introduced into the vacuum furnace heated at the temperature between 1400 and 1600° C. (preferably between 1450 and 1550° C.) at the pressure between 100 and 1000 Pa (preferably between 200 and 900 Pa) to thereby eliminate those impurities capable of readily forming volatile hydrides and to hydrogenate the surface of the carbonaceous material so that such impurities as nitrogen (N), oxygen (O), phosphorus (P) and sulfur (S) can hardly adsorb to the treated surface upon release thereof to the atmosphere (hydrogenation process).

Those treatments make it possible to remove those impurities occurring in pores of the carbonaceous material and/or chemically bound to carbon atoms thereof and, at the same time, prevent the impurities from adsorption thereto again.

An example of such process for producing the high purity carbonaceous material of the invention is given below.

1. High Purification Process

The carbonaceous material to be treated is placed in a graphitization furnace heated between 2400 and 2800° C. at atmospheric pressure, and dichlorodifluoromethane is introduced in the furnace. By this treatment, boron (B) and vanadium (V) can be eliminated with effectively.

2. Ultrahigh Purification Process

The carbonaceous material is put in a vacuum furnace heated between 2000° C. and 2400° C., and chlorine (Cl$_2$) and dichlorodifluoromethane are flowed into the furnace at the pressure between 10000 Pa and 50000 Pa. The flow rate may depend on the amount of the material to be treated. A standard flow rate is generally between 0.1 and 1 NLM/kg. In this process, metal impurities are mainly eliminated in the main.

3. Degassing (Nitrogen Elimination) Process

The carbonaceous material is put in a vacuum furnace at a reduced pressure of 100 Pa or lower and heated between 1400° C. and 1600° C. for 10~50 hours. Volatile impurities such as nitrogen and oxygen are eliminated primarily.

4. Hydrogenation Treatment Process

The carbonaceous material is kept in the vacuum furnace heated between 1400° C. and 1600° C. for 1 to 10 hours while introducing hydrogen at the pressure between 100 Pa and 1000 Pa. Those impurities, which readily form volatile hydrides, are removed and hydrogen is allowed to be adsorbed on the surface of the carbonaceous material under treatment to thereby prevent such impurities as nitrogen (N), oxygen (O), phosphorus (P) and sulfur (S) from adsorbing to the carbonaceous material again.

The analytical method SIMS (secondary ion mass spectrometry) is described here.

SIMS is a method of atomic compositional analysis which measures mass of sputtered charged particle from the material surface with primary ions (generally $O_2^+$, $Cs^+$ or $Ga^+$ ions) accelerated to several hundred volts to 20 kV. The most characteristic feature of SIMS is that all the elements, from $^1H$ to $^{238}U$, contained in the material can be detected. SIMS is classified to static SIMS and dynamic SIMS according to the quantity of primary ions used for sputtering. The latter, namely dynamic SIMS, was used in evaluating the effects of the invention.

The SIMS used for determining impurity concentrations in the high purity carbonaceous material of the invention was CAMECA IMS-3f·4f·4.5f. Different primary ion species were used according to the elements to be measured. Thus, $O_2^+$ ions were used as primary ions for boron (B), aluminum (Al), titanium (Ti), vanadium (V), chromium (Cr), iron (Fe) and nickel (Ni), and $Cs^+$ ions were used for nitrogen (N), oxygen (O), fluorine (F), phosphorus (P), sulfur (S) and chlorine (Cl). After etching to a depth of 5~10 µm using such primary ions, the value at the time when the concentration of an element became constant was taken as the concentration of that element.

For the measurements, test specimens, 7 mm×7 mm×1 mm in size, were prepared in advance from each of the samples of the carbonaceous materials and the ceramic coated carbonaceous materials produced by coating on the high purity carbon material as substrate by the thermal CVD method.

EXAMPLE 1

First, a carbonaceous material to serve as the base material of the high purity carbonaceous material of the invention was prepared using an ordinary pressure: graphitization and high purification attaining furnace.

The heating elements in the atmospheric pressure graphitization and high purification attaining furnace were gradually heated and then a graphitized, isotropic carbon material, 20 mm×20 mm×2 mm in size, produced by Toyo Tanso Co., Ltd. was heated at 2450° C. and at 1 atm. Halogen gases or a halogen compound gases, for example dichlorodifluoromethane, was fed to the furnace for about 8 hours (for example, at a flow rate of about 1~7 NLM, although the flow rate may be varied according to the amount of carbonaceous material placed in the furnace as vacuum vessel) (high purity process).

The high purity carbonaceous material obtained in the high purification process was then maintained at 2250° C. in the furnace under reduced pressure, and halogen gases or halogen compound gases, for example dichlorodifluoromethane, was fed again to the furnace. This treatment was carried out for 5 hours while maintaining the furnace pressure at 1000 Pa (ultrahigh purity process).

Thereafter, the material was cooled to 1450° C. at the pressure of 10 Pa and then maintained at 1450° C. for 48 hours (degassing (nitrogen elimination) process).

After the nitrogen gas elimination process, the material was maintained at 100 Pa for 1 hour with hydrogen introducing (hydrogenation process).

Then, argon gas, as a rare gas, was introduced into the furnace and the material was cooled to room temperature. After cooling to room temperature, the material, together was sealed with argon gas in a polyethylene resin film bag and stored so that it might not be exposed to the air.

EXAMPLE 2

A graphite material was treated in the same high purification process and ultrahigh purification process as in Example 1 and then once taken out of the furnace. It was sealed in a polyethylene resin film bag, and stored with argon gas so that it might not be exposed to the air. This graphite material was taken out of the polyethylene resin film bag and put again in the furnace and heated again to 1450° C. The furnace inside pressure was reduced to 10 Pa, then heat treatment was carried out for 48 hours (degassing (nitrogen elimination) process). After the predetermined period of heat treatment, the material was maintained at 100 Pa for 1 hour while introducing hydrogen into the furnace (hydrogenation process). Argon gas, as a rare gas, was introduced into the furnace, and the material was cooled to room temperature. After cooling to room temperature, the material, together was sealed with argon gas in a polyethylene resin film bag and stored so that it might not be exposed to the air.

EXAMPLE 3

The procedure of Example 1 was carried out in the same manner except that, after reducing the vessel inside pressure to $10^{-2}$ Pa, the degassing (nitrogen elimination) process was carried out at 1450° C. for 24 hours and the hydrogenation process was then carried out at 1450° C.

EXAMPLE 4

A base material having the same size as in Example 1 was prepared from a C/C material (carbon fiber-reinforced carbon composite material) produced by Toyo Tanso Co., Ltd. and treated in the same manner as in Example 1.

EXAMPLE 5

A base material, 20 mm×20 mm×1 mm in size, was prepared from an exfoliated graphite sheet material produced by Toyo Tanso Co., Ltd. and treated in the same manner as in Example 1.

EXAMPLE 6

The same sample base material as used in Example 1 was treated in the same manner as in Example 1 except that the graphite material after the high purification process was treated in the ultrahigh purification process at 2100° C. for 5 hours and, thereafter, the degassing (nitrogen elimination) process was carried out at 1400° C. for 20 hours and the hydrogenation process was carried out at 1400° C. and at 100 Pa for 1 hour while introducing hydrogen. The material thus obtained was used as the sample of Example 6.

EXAMPLE 7

The same sample base material as used in Example 1 was treated in the same manner as in Example 1 except that the graphite material after the high purification process was treated in the ultrahigh purification process at 2100° C. for 5 hours and, thereafter, the degassing (nitrogen elimination) process was carried out at 1500° C. for 20 hours and the hydrogenation process was carried out at 1500° C. and at 100 Pa for 1 hour while introducing hydrogen. The material thus obtained was used as the sample of Example 7.

EXAMPLE 8

The same graphite material as that obtained in Example 1 through the high purification and ultrahigh purification processes, degassing (nitrogen elimination) process and hydrogenation process was used as a substrate and coated with 100 μm thickness of SiC by the thermal CVD method. The material thus obtained was used as the sample of Example 8.

COMPARATIVE EXAMPLE 1

The same sample base material was treated in the same manner as in Example 1 except that the graphite material after the high purification process was subjected neither to the ultrahigh purification process nor the degassing (nitrogen elimination) process but was cooled with nitrogen gas and stored in the atmosphere. The resulting material was used as the sample of Comparative Example 1.

COMPARATIVE EXAMPLE 2

The graphite material after completion of the ultrahigh purification process alone was not subjected to the degassing (nitrogen elimination) process but was cooled with nitrogen gas and stored in the atmosphere. The resulting material was used as the sample of Comparative Example 2.

COMPARATIVE EXAMPLE 3

The graphite material after completion of the high purification and ultrahigh purification processes carried out in the same manner as in Example 1 was not subjected to the degassing (nitrogen elimination) process but was cooled with nitrogen gas and stored in the atmosphere. The resulting material was used as the sample of Comparative Example 3.

COMPARATIVE EXAMPLE 4

The procedure of Example 1 was followed in the same manner except that, after reduction of the furnace pressure to 10 Pa, the degassing (nitrogen elimination) process was carried out at 1450° C. for 48 hours and that the hydrogenation process was not carried out. The thus-obtained material was used as the sample of Comparative Example 4.

COMPARATIVE EXAMPLE 5

The procedure of Example 1 was followed in the same manner except that, after vacuuming pressure to 10 Pa, the degassing (nitrogen elimination) process was carried out at 1300° C. for 48 hours and that the hydrogenation process was carried out at 1300° C., at 100 Pa for 1 hour while introducing hydrogen. The thus-obtained material was used as the sample of Comparative Example 5.

COMPARATIVE EXAMPLE 6

The same graphite material as used in Example 1 was subjected to the ultrahigh purification process, degassing (nitrogen elimination) process and hydrogenation process in the same manner without carrying out the high purification process. The thus-obtained material was used as the sample of Comparative Example 6.

COMPARATIVE EXAMPLE 7

The procedure of Example 1 was followed in the same manner except that, after vacuuming pressure to 10 Pa, the degassing (nitrogen elimination) process was carried out at 1200° C. for 48 hours. The thus-obtained material was used as the sample of Comparative Example 7.

COMPARATIVE EXAMPLE 8

The same C/C material (product of Toyo Tanso Co., Ltd.) as used in Example 4 was treated in the same manner as in Comparative Example 1. The thus-obtained material was used as the sample of Comparative Example 8.

COMPARATIVE EXAMPLE 9

The same exfoliated graphite sheet material (product of Toyo Tanso Co., Ltd.) as used in Example 5 was treated in the same manner as in Comparative Example 1. The thus-obtained material was used as the sample of Comparative Example 9.

COMPARATIVE EXAMPLE 10

On the surface of the graphite material obtained after completion of the high purification and ultrahigh purification processes in the same manner as in Comparative Example 3, there was coated SiC layer in the same manner as in Example 8. The thus-obtained material was used as the sample of Comparative Example 10.

The impurity concentrations in the graphite materials of Examples 1 to 7 and Comparative Examples 1 to 9 were determined by the SIMS method described hereinabove. The impurity concentrations in the samples of Examples 1 to 7 are summarized in Table 1, and the impurity concentrations in the samples of Comparative Examples 1 to 9 are summarized in Table 2. The impurity concentrations in the sample of Example 8 and the sample of Comparative Example 10 were also determined by the SIMS method described above. The impurity concentrations in the samples of Example 8 and Comparative Example 10 are summarized in Table 3.

TABLE 1

(unit: atoms/cm³)

| | Example 1 | Example 2 | Example 3 | Example 4 | Example 5 | Example 6 | Example 7 |
|---|---|---|---|---|---|---|---|
| B  | $1.5 \times 10^{15}$ | $4.0 \times 10^{15}$ | $4.2 \times 10^{14}$ | $9.8 \times 10^{15}$ | $4.2 \times 10^{16}$ | $9.9 \times 10^{15}$ | $9.7 \times 10^{15}$ |
| N  | $5.0 \times 10^{18}$ | $6.0 \times 10^{16}$ | $<4.0 \times 10^{16}$ | $8.9 \times 10^{15}$ | $4.2 \times 10^{17}$ | $2.1 \times 10^{16}$ | $4.3 \times 10^{16}$ |
| O  | $9.5 \times 10^{16}$ | $1.2 \times 10^{17}$ | $8.3 \times 10^{15}$ | $2.8 \times 10^{17}$ | $9.7 \times 10^{17}$ | $1.3 \times 10^{18}$ | $3.0 \times 10^{17}$ |
| F  | $2.2 \times 10^{14}$ | $4.0 \times 10^{14}$ | $2.0 \times 10^{14}$ | $3.0 \times 10^{14}$ | $8.2 \times 10^{14}$ | $2.5 \times 10^{14}$ | $2.5 \times 10^{14}$ |
| Al | $<4.0 \times 10^{13}$ | $<4.0 \times 10^{13}$ | $<4.0 \times 10^{13}$ | $<4.0 \times 10^{13}$ | $<4.0 \times 10^{13}$ | $5.3 \times 10^{13}$ | $<4.0 \times 10^{13}$ |
| P  | $2.8 \times 10^{15}$ | $1.7 \times 10^{15}$ | $3.2 \times 10^{14}$ | $2.5 \times 10^{15}$ | $8.6 \times 10^{15}$ | $1.6 \times 10^{16}$ | $9.2 \times 10^{15}$ |
| S  | $3.0 \times 10^{16}$ | $2.2 \times 10^{15}$ | $6.5 \times 10^{14}$ | $6.7 \times 10^{15}$ | $9.8 \times 10^{15}$ | $2.1 \times 10^{15}$ | $1.1 \times 10^{18}$ |
| Cl | $<5.5 \times 10^{14}$ | $1.2 \times 10^{14}$ | $<5.5 \times 10^{14}$ | $3.7 \times 10^{15}$ | $8.2 \times 10^{15}$ | $5.2 \times 10^{15}$ | $1.3 \times 10^{15}$ |
| Ti | $<5.0 \times 10^{13}$ | $1.0 \times 10^{14}$ | $<5.0 \times 10^{13}$ | $<5.0 \times 10^{13}$ | $<5.0 \times 10^{13}$ | $<1.1 \times 10^{14}$ | $<1.1 \times 10^{14}$ |
| V  | $4.5 \times 10^{14}$ | $4.5 \times 10^{14}$ | $4.0 \times 10^{14}$ | $4.1 \times 10^{14}$ | $7.2 \times 10^{14}$ | $3.2 \times 10^{15}$ | $9.8 \times 10^{14}$ |
| Cr | $3.8 \times 10^{14}$ | $3.0 \times 10^{14}$ | $2.0 \times 10^{14}$ | $1.8 \times 10^{14}$ | $8.2 \times 10^{14}$ | $4.5 \times 10^{14}$ | $5.2 \times 10^{14}$ |
| Fe | $4.1 \times 10^{14}$ | $3.6 \times 10^{14}$ | $2.8 \times 10^{14}$ | $5.2 \times 10^{14}$ | $6.5 \times 10^{14}$ | $4.2 \times 10^{14}$ | $8.3 \times 10^{14}$ |
| Ni | $<3.0 \times 10^{13}$ | $<3.0 \times 10^{13}$ | $<3.0 \times 10^{13}$ | $<3.0 \times 10^{13}$ | $<3.0 \times 10^{13}$ | $<3.0 \times 10^{13}$ | $<3.0 \times 10^{13}$ |

TABLE 2

(unit: atoms/cm³)

| | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|
| B  | $1.8 \times 10^{18}$ | $2.0 \times 10^{18}$ | $1.5 \times 10^{16}$ | $2.1 \times 10^{15}$ | $1.1 \times 10^{16}$ | $2.1 \times 10^{16}$ | $2.5 \times 10^{18}$ | $1.3 \times 10^{16}$ | $7.2 \times 10^{16}$ |
| N  | $1.0 \times 10^{18}$ | $6.5 \times 10^{17}$ | $4.0 \times 10^{17}$ | $1.3 \times 10^{17}$ | $3.1 \times 10^{17}$ | $1.1 \times 10^{16}$ | $4.8 \times 10^{17}$ | $1.5 \times 10^{18}$ | $9.2 \times 10^{17}$ |
| O  | $3.2 \times 10^{18}$ | $1.5 \times 10^{18}$ | $1.2 \times 10^{18}$ | $2.1 \times 10^{18}$ | $1.3 \times 10^{18}$ | $1.1 \times 10^{18}$ | $1.1 \times 10^{18}$ | $1.6 \times 10^{18}$ | $1.6 \times 10^{18}$ |
| F  | $7.2 \times 10^{17}$ | $4.5 \times 10^{17}$ | $4.0 \times 10^{14}$ | $8.2 \times 10^{15}$ | $4.2 \times 10^{16}$ | $5.4 \times 10^{16}$ | $8.8 \times 10^{16}$ | $1.3 \times 10^{17}$ | $6.5 \times 10^{15}$ |
| Al | $1.3 \times 10^{18}$ | $1.5 \times 10^{15}$ | $8.3 \times 10^{14}$ | $<4.0 \times 10^{13}$ | $<4.0 \times 10^{13}$ | $2.3 \times 10^{16}$ | $<4.0 \times 10^{13}$ | $7.2 \times 10^{13}$ | $8.6 \times 10^{13}$ |
| P  | $7.3 \times 10^{18}$ | $2.2 \times 10^{16}$ | $1.5 \times 10^{16}$ | $1.7 \times 10^{16}$ | $1.1 \times 10^{16}$ | $4.8 \times 10^{16}$ | $2.0 \times 10^{16}$ | $1.5 \times 10^{18}$ | $1.3 \times 10^{15}$ |
| S  | $6.4 \times 10^{17}$ | $1.5 \times 10^{15}$ | $6.0 \times 10^{15}$ | $4.2 \times 10^{15}$ | $1.3 \times 10^{15}$ | $7.4 \times 10^{15}$ | $8.2 \times 10^{16}$ | $5.3 \times 10^{15}$ | $2.1 \times 10^{15}$ |
| Cl | $7.6 \times 10^{16}$ | $2.5 \times 10^{16}$ | $1.2 \times 10^{15}$ | $8.4 \times 10^{14}$ | $1.5 \times 10^{15}$ | $1.3 \times 10^{15}$ | $1.0 \times 10^{16}$ | $3.8 \times 10^{15}$ | $1.2 \times 10^{15}$ |
| Ti | $7.2 \times 10^{14}$ | $1.3 \times 10^{15}$ | $<1.1 \times 10^{15}$ | $<5.0 \times 10^{13}$ | $<5.0 \times 10^{13}$ | $<5.0 \times 10^{13}$ | $<5.0 \times 10^{13}$ | $<5.0 \times 10^{13}$ | $<5.0 \times 10^{13}$ |
| V  | $8.2 \times 10^{15}$ | $8.5 \times 10^{16}$ | $1.1 \times 10^{15}$ | $6.2 \times 10^{14}$ | $5.2 \times 10^{14}$ | $2.3 \times 10^{15}$ | $5.8 \times 10^{14}$ | $8.9 \times 10^{14}$ | $1.6 \times 10^{16}$ |
| Cr | $2.4 \times 10^{15}$ | $2.0 \times 10^{15}$ | $2.0 \times 10^{15}$ | $5.5 \times 10^{14}$ | $4.8 \times 10^{14}$ | $8.5 \times 10^{14}$ | $4.0 \times 10^{14}$ | $6.2 \times 10^{14}$ | $1.8 \times 10^{16}$ |
| Fe | $7.5 \times 10^{14}$ | $6.5 \times 10^{15}$ | $8.3 \times 10^{14}$ | $5.2 \times 10^{14}$ | $6.0 \times 10^{14}$ | $9.8 \times 10^{14}$ | $6.2 \times 10^{14}$ | $8.8 \times 10^{14}$ | $1.8 \times 10^{16}$ |
| Ni | $6.3 \times 10^{14}$ | $1.5 \times 10^{15}$ | $8.7 \times 10^{13}$ | $<3.0 \times 10^{13}$ | $<3.0 \times 10^{13}$ | $4.8 \times 10^{14}$ | $<3.0 \times 10^{13}$ | $<3.0 \times 10^{13}$ | $9.2 \times 10^{13}$ |

TABLE 3

(unit: atoms/cm³)

| | Example 8 | Comparative Example 10 |
|---|---|---|
| B  | $4.6 \times 10^{15}$ | $3.5 \times 10^{17}$ |
| N  | $8.7 \times 10^{16}$ | $4.9 \times 10^{16}$ |
| Al | $<6.0 \times 10^{13}$ | $1.4 \times 10^{14}$ |
| Ti | $<2.5 \times 10^{13}$ | $<2.5 \times 10^{13}$ |
| V  | $8.3 \times 10^{13}$ | $9.9 \times 10^{14}$ |
| Fe | $<3.2 \times 10^{13}$ | $2.9 \times 10^{14}$ |
| Ni | $4.7 \times 10^{13}$ | $8.9 \times 10^{14}$ |

The data in Table 1 and Table 2 indicate that the graphite materials obtained in Examples 1 to 7 through the nitrogen gas elimination process are lower in nitrogen content as compared with the graphite materials of Comparative Examples 1 to 9 respectively. Accordingly, the low-nitrogen-concentration graphite materials of Examples 1 to 7 can be used as tools or jigs in the production of SiC semiconductors and so forth while preventing the occurrence of crystal defects in semiconductor devices such as SiC semiconductors.

Furthermore, the use of the graphite materials of Examples 1 to 4 and 7, which are low in boron concentration as well, makes it possible to produce low-donor-density SiC semiconductors.

The graphite material of Example 6, which has a reduced boron concentration as well, can be utilized as a tools or jigs for silicon single crystals in the Czochralski process, for instance, and can thus contribute toward markedly reducing the boron concentration in the product silicon single crystals.

Further, when the graphite materials of Examples 1 to 7 are used as graphite parts to be used in nuclear reactors, for example graphite moderators in nuclear reactors or graphite-made fuel blocks in high-temperature gas-cooled reactors, radioactivity can be suppressed owing to their low impurity concentrations.

The data in Table 3 indicate that when the graphite material low in impurity concentrations is used as the base graphite material for SiC coating, the concentrations of impurities, for example boron and nitrogen, in addition to metal impurities, in the SiC layer can be reduced. Accordingly, by using the SiC-coated graphite material of Example 8 as tools or jigs in the manufacture of silicon semiconductors, it becomes possible to reduce the impurity concentrations in epitaxial silicon layers.

Various alterations and modifications to the present invention can be made without departing the spirit or scope of the invention claimed in the appended claims and the above examples are by no means limitative of the scope of the invention.

What is claimed is:

1. A high purity carbon material which is graphite or carbon fiber reinforced carbon composite having an oxygen content of $1 \times 10^{18}$ atoms/cm³ or less as determined by SIMS.

2. A high purity carbon material according to claim 1 which has a chlorine content of $10^{16}$ atoms/cm³ or less as determined by SIMS.

3. A high purity carbon material according to claim 1 or 2 which has a nitrogen content of $5\times10^{18}$ atoms/cm$^3$ or less as determined by SIMS.

4. A high purity carbon material according to claim 1 or 2 which has a phosphorus content of $1\times10^{16}$ atoms/cm$^3$ or less as determined by SIMS.

5. A high purity carbon material according to claim 1 or 2 which has a sulfur content of not higher than $1\times10^{16}$ atoms/cm$^3$ as determined by SIMS.

6. A high purity carbon material according to claim 1 or 2 which has a boron content of $5\times10^{16}$ atoms/cm$^3$ or less as determined by SIMS.

7. A high purity carbon material which is graphite or carbon fiber reinforced carbon composite having a boron content of not higher than $1\times10^{16}$ atoms/cm$^3$ as determined by SIMS and a nitrogen content of $5\times10^{18}$ atoms/cm$^3$ or less as determined by SIMS.

8. A ceramic layer-coated high purity carbon material comprising a high purity carbon material according to claim 1 or 7 as a substrate of ceramics coating.

9. A method of preparing a ceramic-coated substrate comprising coating the high purity carbon material according to claim 1 or 7 with a ceramic coating.

10. A method of preventing crystal defects during the manufacture of silicon carbide single crystals, silicon single crystals, gallium nitride single crystals or calcium fluoride single crystals comprising employing the high purity carbon material according to claim 1 or 7 in the manufacture of said crystals.

11. A method of manufacturing silicon carbide, gallium nitride or silicon, comprising epitaxial growing silicon carbide, gallium nitride or silicon in the presence of the high purity carbon material according to claim 1 or 7.

* * * * *